United States Patent
Korneisel et al.

(10) Patent No.: US 11,605,570 B2
(45) Date of Patent: Mar. 14, 2023

(54) RECONSTITUTED WAFER INCLUDING INTEGRATED CIRCUIT DIE MECHANICALLY INTERLOCKED WITH MOLD MATERIAL

(71) Applicant: Rockwell Collins, Inc., Cedar Rapids, IA (US)

(72) Inventors: Richard Korneisel, Cedar Rapids, IA (US); Nathaniel P. Wyckoff, Marion, IA (US); Brandon C. Hamilton, Marion, IA (US); Bret W. Simon, West Liberty, IA (US); Jacob R. Mauermann, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 17/017,196

(22) Filed: Sep. 10, 2020

(65) Prior Publication Data
US 2022/0077016 A1  Mar. 10, 2022

(51) Int. Cl.
*H01L 23/31* (2006.01)
*H01L 21/56* (2006.01)

(52) U.S. Cl.
CPC ........ *H01L 23/3142* (2013.01); *H01L 21/561* (2013.01); *H01L 21/563* (2013.01); *H01L 23/3128* (2013.01)

(58) Field of Classification Search
None
See application file for complete search history.

(56) References Cited

U.S. PATENT DOCUMENTS

| | | |
|---|---|---|
| 7,208,345 B2 | 4/2007 | Meyer et al. |
| 7,300,824 B2 | 11/2007 | Sheats |
| 8,698,326 B2 | 4/2014 | Huang et al. |
| 8,735,220 B2 | 5/2014 | Wal |
| 8,916,481 B2 | 12/2014 | Gan et al. |
| 9,257,355 B2 | 2/2016 | Smith et al. |
| 9,318,459 B2 | 4/2016 | Hwang et al. |
| 9,627,261 B1 | 4/2017 | Rahman et al. |
| 10,103,117 B2 | 10/2018 | Jung et al. |
| 10,204,879 B2 | 2/2019 | Lin et al. |
| 10,510,724 B2 | 12/2019 | Yoo et al. |

(Continued)

FOREIGN PATENT DOCUMENTS

| | | |
|---|---|---|
| EP | 2985787 A1 | 2/2016 |
| EP | 2441088 B1 | 7/2016 |

(Continued)

OTHER PUBLICATIONS

Reconstituted, (n.d.) Collins English Dictionary—Complete and Unabridged, 12th Edition 2014. (1991, 1994, 1998, 2000, 2003, 2006, 2007, 2009, 2011, 2014). Retrieved Feb. 8, 2022 from https://www.thefreedictionary.com/reconstituted (Year: 2022).*

(Continued)

*Primary Examiner* — Jay C Chang
(74) *Attorney, Agent, or Firm* — Suiter Swantz pc llo

(57) ABSTRACT

A system and method. The system may include an integrated circuit (IC) die. The IC die may have two faces and sides. The system may further include mold material. The mold material may surround at least the sides of the IC die. The IC die may be mechanically interlocked with the mold material.

12 Claims, 9 Drawing Sheets

(56) References Cited

U.S. PATENT DOCUMENTS

| | | |
|---|---|---|
| 10,515,927 B2 | 12/2019 | Lianto et al. |
| 10,651,051 B2 | 5/2020 | Sankman et al. |
| 2012/0282767 A1 | 11/2012 | Jin et al. |
| 2013/0334680 A1 | 12/2013 | Boone et al. |
| 2014/0057394 A1 | 2/2014 | Ramasamy et al. |
| 2014/0110842 A1* | 4/2014 | Zenz ............... H01L 29/0657 257/738 |
| 2014/0183761 A1* | 7/2014 | Lin .................... H01L 24/97 257/787 |
| 2015/0364453 A1 | 12/2015 | Schunk |
| 2016/0049348 A1* | 2/2016 | Zhao ................. H01L 21/565 257/620 |
| 2016/0155728 A1 | 6/2016 | Zhao et al. |
| 2017/0309582 A1* | 10/2017 | Meyer ................ H01Q 1/2283 |
| 2019/0109048 A1 | 4/2019 | Strothmann et al. |
| 2019/0165108 A1 | 5/2019 | Kazemi et al. |
| 2019/0221465 A1 | 7/2019 | Kilger et al. |
| 2019/0267287 A1 | 8/2019 | Hariharan et al. |
| 2019/0348459 A1 | 11/2019 | Katkar |
| 2019/0355272 A1 | 11/2019 | Nusbaum et al. |
| 2020/0118973 A1 | 4/2020 | Wang et al. |
| 2020/0212537 A1 | 7/2020 | Chuang et al. |

FOREIGN PATENT DOCUMENTS

| | | |
|---|---|---|
| JP | 2014192170 A | 10/2014 |
| TW | I624894 B | 5/2018 |

OTHER PUBLICATIONS

Extended Search Report in European Application No. 21195770.9 dated Jun. 23, 2022, 13 pages.

* cited by examiner

1500

1502 — CREATING A RECONSTITUTED WAFER, THE RECONSTITUTED WAFER COMPRISING A PLURALITY OF INTEGRATED CIRCUIT (IC) DIES AND A MOLD MATERIAL, THE PLURALITY OF IC DIES COMPRISING AN IC DIE, THE IC DIE HAVING TWO FACES AND SIDES, WHEREIN THE MOLD MATERIAL SURROUNDS AT LEAST THE SIDES OF THE IC DIE, WHEREIN THE PLURALITY OF IC DIES ARE MECHANICALLY INTERLOCKED WITH THE MOLD MATERIAL

1602 — CREATING A RECONSTITUTED WAFER, THE RECONSTITUTED WAFER COMPRISING AN INTEGRATED CIRCUIT (IC), A MOLD MATERIAL, A REDISTRIBUTION LAYER, AND SIGNAL PADS, WHEREIN THE IC DIE HAS TWO FACES AND SIDES, WHEREIN THE MOLD MATERIAL SURROUNDS AT LEAST THE SIDES OF THE IC DIE, WHEREIN THE REDISTRIBUTION LAYER IS POSITIONED BETWEEN (A) THE SIGNAL PADS AND (B) THE MOLD MATERIAL AND THE IC DIE, WHEREIN REDISTRIBUTION LAYER HAS CONDUCTIVE PATHS AT LEAST CONNECTING THE IC DIE AND AT LEAST SOME OF THE SIGNAL PADS, WHEREIN A SURFACE OF THE MOLD MATERIAL ABUTS THE REDISTRIBUTION LAYER, WHEREIN THE SURFACE OF THE MOLD MATERIAL INCLUDES AT LEAST ONE RECESSED AREA HAVING AT LEAST ONE CONDUCTIVE FEATURE CONNECTED TO AT LEAST ONE OF THE CONDUCTIVE PATHS OR THE IC DIE

FIG. 16

RECONSTITUTED WAFER INCLUDING INTEGRATED CIRCUIT DIE MECHANICALLY INTERLOCKED WITH MOLD MATERIAL

CROSS-REFERENCE TO RELATED APPLICATIONS

The present application is related to U.S. application Ser. No. 17/017,235, titled RECONSTITUTED WAFER INCLUDING MOLD MATERIAL WITH RECESSED CONDUCTIVE FEATURE, filed Sep. 10, 2020. U.S. application Ser. No. 17/017,235 is herein incorporated by reference in its entirety.

BACKGROUND

In microelectronics packaging, secondary processing of a die that stores program information in an integrated circuit (IC) design is important for interconnect initiatives. To improve reliability, repeatability, and throughput of the die during secondary processing, multiple dies are often molded together into a reconstituted wafer. Once in the reconstituted wafer, the dies can be handled with ease and can be processed simultaneously. However, adhesion of mold material to the dies is the sole method for holding the dies in place, and it is common for dies to come loose during processing or to mechanically fail in a thermal cycle or shock testing. Additionally, a traditional reconstituted wafer typically has only one side of each die face exposed for secondary processing. Backside mold material can be removed to expose a backside face of the die, but this can cause manufacturing issues because the die can experience mechanical failure if the die experiences pressure on either face of the die. For this reason, dual-sided processing of reconstituted wafers is seldom performed despite the expanded design possibilities.

In microelectronics packaging, reconstituted wafers are often used as a manufacturing aid in die processing, or as a method to mold many devices into a single package. Traditionally, a redistribution layer is used to connect the devices to one another and to the I/O of the package. However, the number of incorporated devices and complexity of the package may be limited by the area of the active face of the package and the interconnect density capabilities of the redistribution layer.

SUMMARY

In one aspect, embodiments of the inventive concepts disclosed herein are directed to a system. The system may include an integrated circuit (IC) die. The IC die may have two faces and sides. The system may further include mold material. The mold material may surround at least the sides of the IC die. The IC die may be mechanically interlocked with the mold material.

In a further aspect, embodiments of the inventive concepts disclosed herein are directed to a method. The method may include: creating a reconstituted wafer, the reconstituted wafer comprising a plurality of integrated circuit (IC) dies and a mold material, the plurality of IC dies comprising an IC die, the IC die having two faces and sides, wherein the mold material surrounds at least the sides of the IC die, wherein the plurality of IC dies are mechanically interlocked with the mold material.

In one aspect, embodiments of the inventive concepts disclosed herein are directed to a system. The system may include an integrated circuit (IC) die having two faces and sides. The system may further include mold material surrounding at least the sides of the IC die. The system may further include a redistribution layer and signal pads. The redistribution layer may be positioned between (a) the signal pads and (b) the mold material and the IC die. The redistribution layer may have conductive paths at least connecting the IC die and at least some of the signal pads. A surface of the mold material may abut the redistribution layer. The surface of the mold material may include at least one recessed area having at least one conductive feature connected to at least one of the conductive paths or the IC die.

In a further aspect, embodiments of the inventive concepts disclosed herein are directed to a method. The method may include: creating a reconstituted wafer, the reconstituted wafer comprising an integrated circuit (IC), a mold material, a redistribution layer, and signal pads, wherein the IC die has two faces and sides, wherein the mold material surrounds at least the sides of the IC die, wherein the redistribution layer is positioned between (a) the signal pads and (b) the mold material and the IC die, wherein redistribution layer has conductive paths at least connecting the IC die and the signal pads, wherein a surface of the mold material abuts the redistribution layer, wherein the surface of the mold material includes at least one recessed area having at least one conductive feature connected to at least one of the conductive paths or the IC die.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings:

FIG. 15 is a diagram of an exemplary embodiment of a method according to the inventive concepts disclosed herein.

FIG. 16 is a diagram of an exemplary embodiment of a method according to the inventive concepts disclosed herein.

DETAILED DESCRIPTION

Figure 1:
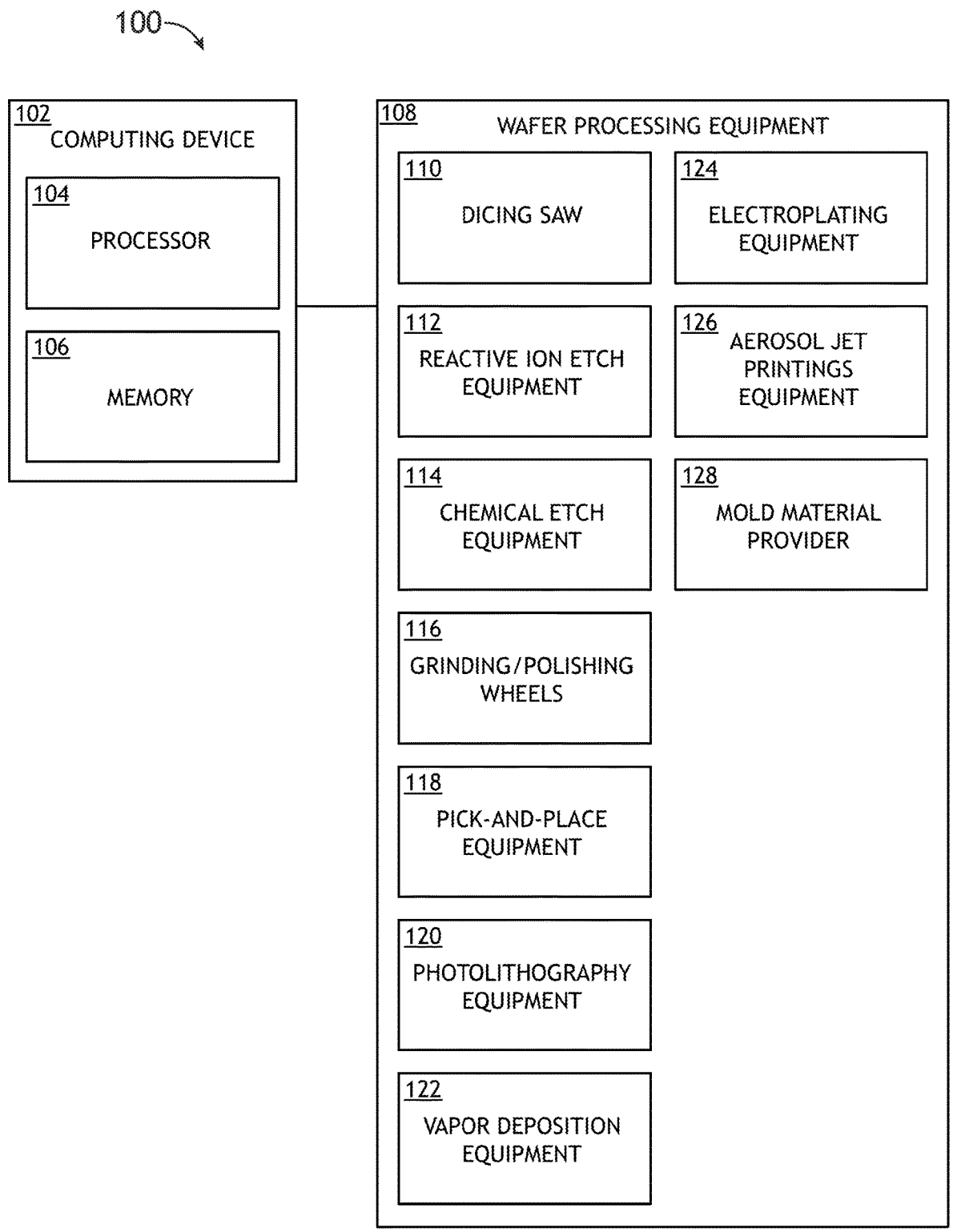
FIG. 1 is a view of an exemplary embodiment of a system in according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a method and a system including at least one IC die and mold material.

Figure 2:
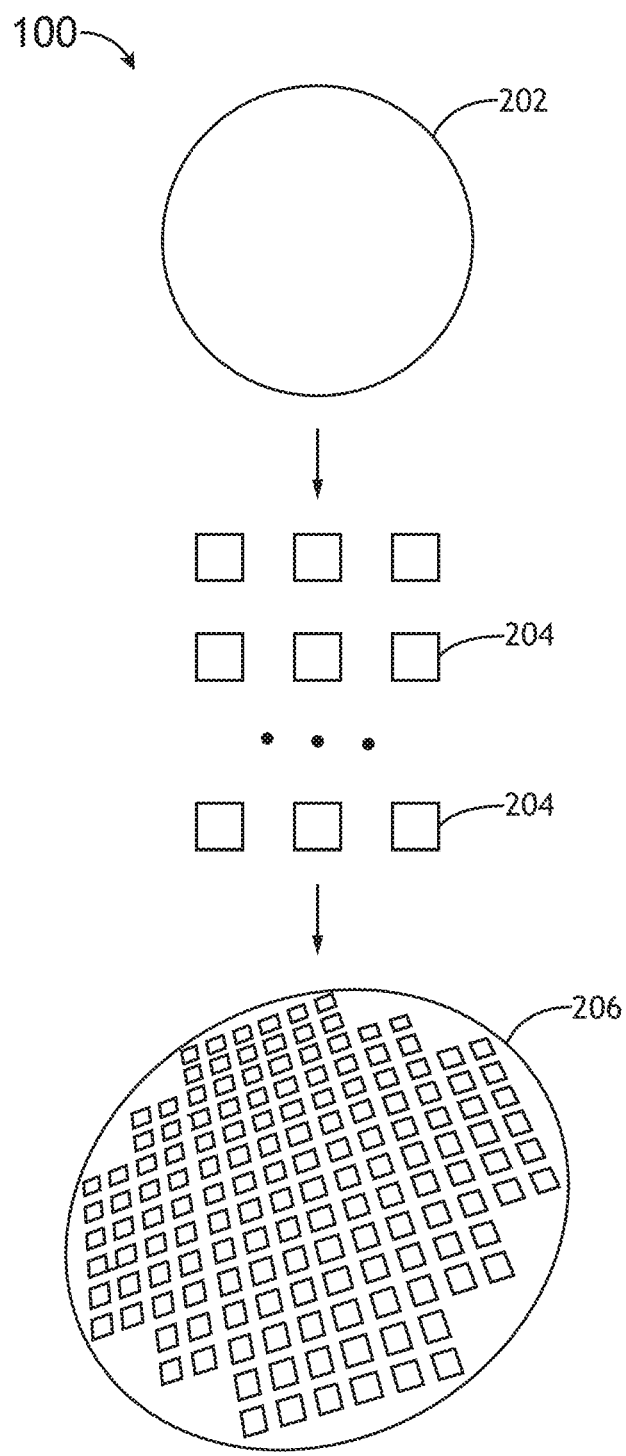
FIG. 2 is an exemplary view of the system of FIG. 1 according to the inventive concepts disclosed herein.

Referring now to FIGS. 1 and 2, an exemplary embodiment of a system 100 according to the inventive concepts disclosed herein is depicted. The system 100 may be implemented as any suitable system, such as at least one wafer processing system, an IC packaging facility, or a fab. The system may include at least one computing device 102, wafer processing equipment 108, at least one wafer 202, at least one IC die 204, at least one reconstituted wafer 206, and/or at least one IC package.

The at least one computing device 102 may be implemented as any suitable computing device. For example, the computing device 102 may include at least one processor 104, at least one memory 106, and/or any suitable user interface(s), some or all of which may be communicatively coupled at any given time. For example, the at least one processor 104 may include at least one central processing unit (CPU), at least one graphics processing unit (GPU), at least one field-programmable gate array (FPGA), at least one application specific integrated circuit (ASIC), at least one digital signal processor, at least one virtual machine (VM) running on at least one processor, and/or the like configured to perform (e.g., collectively perform if more than one processor) or cause (e.g., collectively cause if more than one processor) to be performed any of the operations disclosed throughout. The processor 104 may be configured to run various software applications or computer code stored (e.g., maintained) in a non-transitory computer-readable medium (e.g., memory 106) and configured to execute various instructions or operation. For example, the processor 104 of the computing device 102 may be configured to: cause the wafer processing equipment 108 to perform any of various operations; and/or cause the wafer processing equipment 108 to create a reconstituted wafer 206 according to any of various embodiments disclosed throughout.

The wafer processing equipment 108 may be configured to perform any operation disclosed throughout, such as to create a reconstituted wafer 206 according to any of various embodiments disclosed throughout. For example, the wafer processing equipment 108 may include at least one saw (e.g., at least one dicing saw 110), reactive ion etch equipment 112, chemical etch equipment 114, at least one grinding and/or polishing wheel 116, pick-and-place equipment 118, photolithography equipment 120, vapor deposition 122, electroplating equipment 124, at least one printer (e.g., aerosol jet printing equipment 126), and/or at least one mold material provider 128. For example, the dicing saw 110 may be used to mechanically remove material to a specified depth or at a geometry dictated by the blade geometry. For example, the reactive ion etch equipment 112 may etch away exposed and/or susceptible regions of a substrate to a desired geometry via chemically reactive plasma. For example, the Bosch process is a reactive ion etching process. For example, the chemical etch equipment 114 may etch away exposed and/or susceptible regions of a substrate to a desired geometry via chemical reactions. For example, the grinding and/or polishing wheel 116 may mechanically remove material (typically in a planar fashion) at a rate controlled by wheel speed.

For example, as shown in FIG. 2, the wafer processing equipment 108 (e.g., the dicing saw 110) may dice the wafer 202 into IC dies 204. Additionally, the wafer processing equipment 108 may embed the IC dies into mold material (e.g., 302) to form a reconstituted wafer 206.

Figure 3:
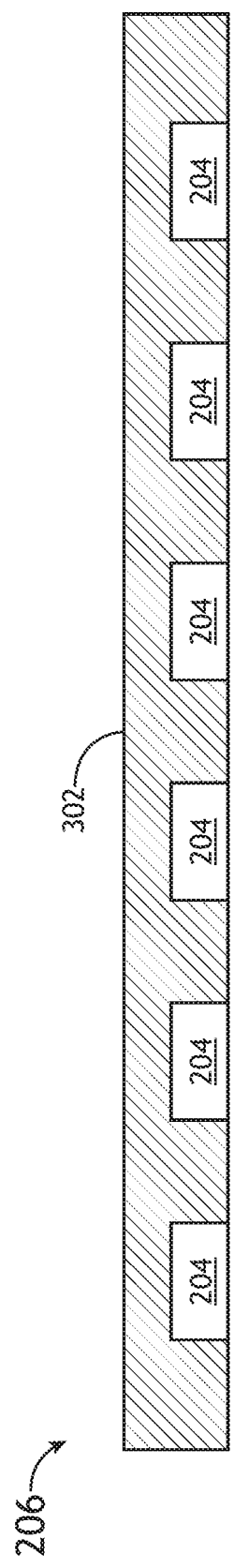
FIG. 3 is a view of an exemplary embodiment of a reconstituted wafer of the system of FIG. 1 according to the inventive concepts disclosed herein.
Figure 4:
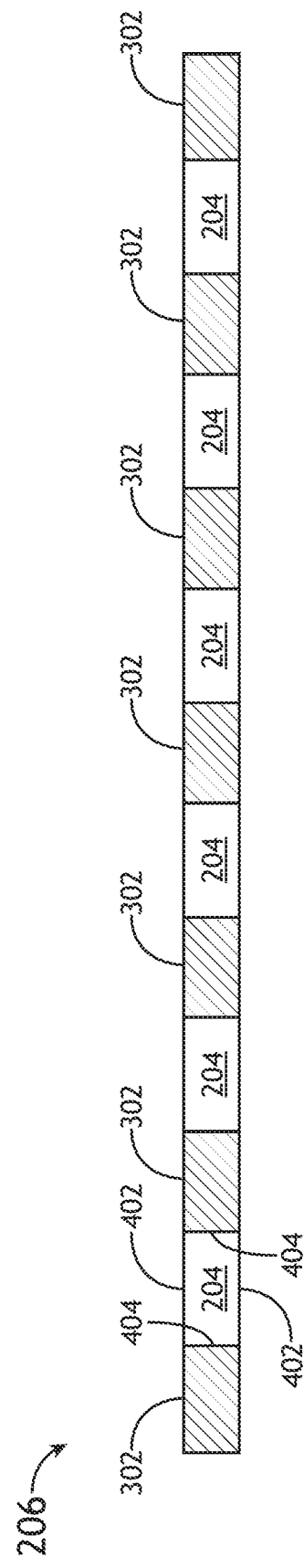
FIG. 4 is a view of an exemplary embodiment of a reconstituted wafer of the system of FIG. 1 according to the inventive concepts disclosed herein.

Referring now to FIGS. 3 and 4, exemplary embodiments of the reconstituted wafer 206 according to the inventive concepts disclosed herein are depicted. As shown in FIGS. 3 and 4, the reconstituted wafer 206 may include mold material 302 and at least one IC die 204 (e.g., an array of IC dies 204).

Each IC die 204 may include two faces 402 and sides 404 (e.g., four sides). In some embodiments, one of the faces 402 may be a front side face 402 and the other a backside face 402. In some embodiments, the backside face 402 may be inactive, and the front side face 402 may be active. Each of the two faces 402 may have a larger surface area than each of the sides 404. In some embodiments, the IC dies 204 may be at least one application specific integrated circuit (ASIC) die, at least one field-programmable gate array (FPGA) die, at least one central processing unit (CPU) die, or at least one graphics processing unit (GPU) die.

The mold material 302 may be any suitable mold material for use in a reconstituted wafer 206. For example, the mold material may be an epoxy molding compound, a liquid compression molding compound, or a liquid encapsulant. The mold material 302 may surround at least the sides 404 of the IC die 204. In some embodiments, the at least one IC die 204 may be mechanically interlocked with the mold material 302, such as shown in FIGS. 5-10. In some embodiments, a plurality of IC dies 204 may be mechanically interlocked with the mold material 302.

As shown in FIG. 3, in some embodiments, the reconstituted wafer 206 may have backside mold material covering the backside faces 402 of the IC dies 204.

As shown in FIG. 4, in some embodiments, the reconstituted wafer 206 has no backside mold material, wherein the two faces 402 of the IC dies 204 may be exposed for dual-side processing. For example, the mold material 302 may not surround either of the two faces 402 of each IC die 204.

Referring now to FIGS. 5-11, exemplary embodiments of the reconstituted wafer 206 according to the inventive concepts disclosed herein are depicted. In some embodiments, the at least one IC die 204 may be mechanically interlocked with the mold material 302. In some embodiments, the wafer processing equipment 108 may form features on the IC die 204 that may mechanically interlock with the mold material 302. In some embodiments, increased surface area and/or mechanical interlock designs may provide significant value to microelectronic packaging capabilities. For example, by acting as a manufacturing aid, the manufacturability and yield in reconstituted wafer processing may be improved. The packages may also be more robust, reliable, and stand up better to environmental and mechanical testing with an increased surface area and/or mechanical interlock design. Additionally, for example, secondary processing may be available on both faces 402 of the dies 204 by using micro and/or macro level mechanical interlock designs, and this may open possibilities for advanced additive manufacturing procedures including deposition of heat spreading material or conductive traces on one or both faces 402 of the die 204.

In some embodiments, the features on the IC die 204 that may mechanically interlock with the mold material 302 may be formed by the wafer processing equipment 108. For example, once an appropriate interlock mechanism is determined for the die 204 based on a given application, the wafer processing equipment 108 may shape the die 204 to a desired interlock geometry, for example, via one or more of the following processes: dicing, reactive ion etch, chemical etch, or grinding/polishing; and such processes can be performed at the wafer level and/or at the die level depending on the geometry and the wafer processing equipment 108 used. Once at least one die 204 having the mechanically interlockable features is singulated, the at least one die 204 may be placed on a non-wetting surface and may be encapsulated with the mold material 302 to form the reconstituted wafer 206. While in the reconstituted wafer 206, the at least one IC die 204 may be processed as desired (e.g., adding redistribution layer(s), performing inactive face processing, etc.). Once the reconstituted wafer 206 is processed, the IC die(s) 204 may be diced completely out of the mold compound 302 to release the die(s) 204, or the IC die(s) 204 may be diced out of the reconstituted wafer 206 with surrounding mold material 302 if the IC die(s) 204 are to be incorporated into a product with surrounding mold material 302.

Figure 5:
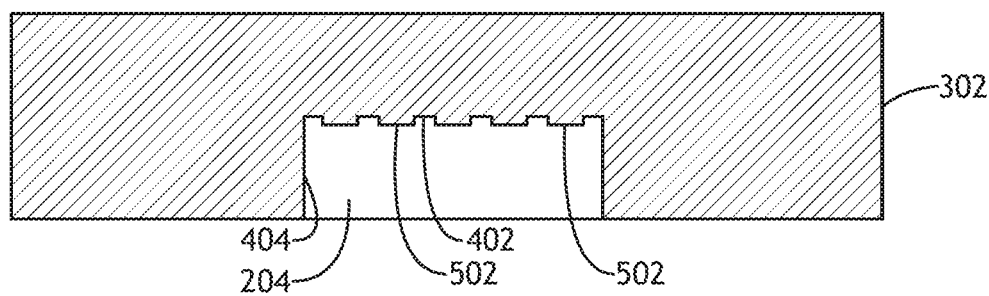
FIG. 5 is a view of an exemplary embodiment of a reconstituted wafer of the system of FIG. 1 according to the inventive concepts disclosed herein.

As shown in FIG. 5, for example, an inactive face 402 of the two faces 402 may have at least one channel 502 that mechanically interlocks with the mold material 302. In some embodiments, the IC die 204 may have material removed along the inactive face 402 such that the inactive face 402 of the IC die 204 mechanically interlocks with the mold material 302. In some embodiments, an inactive face 402 of the two faces 402 may have at least one rough surface that mechanically interlocks with the mold material 302. For example, the dicing saw 110 may cut channels 502 into the inactive face 402 of the IC die 204 to increase the surface area that will interface with the mold material 302 so as to allow adhesion of the IC die 204 to the mold material for providing more strongly bonded IC die 204 in the reconstituted wafer 206. In some embodiments, the channels 502 may be formed by other wafer processing equipment, such as etch equipment 112, 114 that may use a masking material to determine edge and channel 502 geometry.

Figure 6:
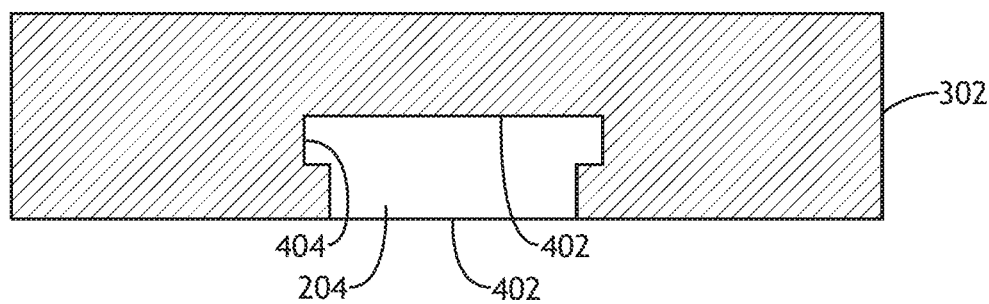
FIG. 6 is a view of an exemplary embodiment of a reconstituted wafer of the system of FIG. 1 according to the inventive concepts disclosed herein.
Figure 7:
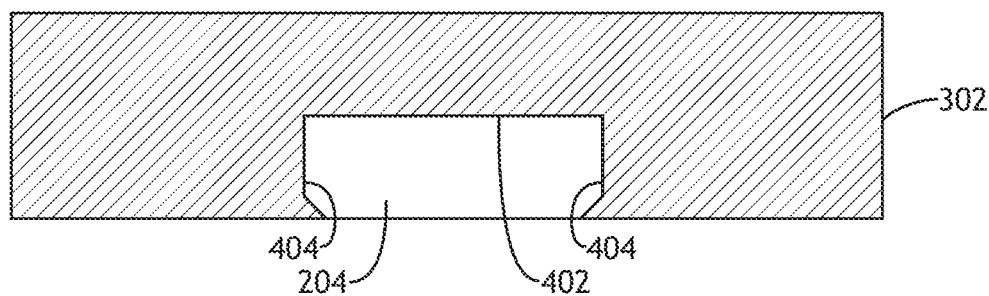
FIG. 7 is a view of an exemplary embodiment of a reconstituted wafer of the system of FIG. 1 according to the inventive concepts disclosed herein.
Figure 8:
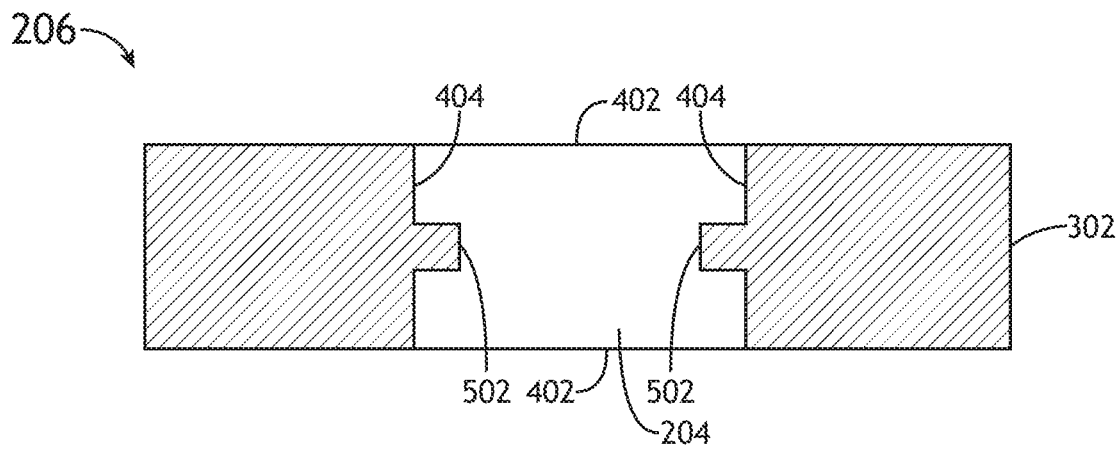
FIG. 8 is a view of an exemplary embodiment of a reconstituted wafer of the system of FIG. 1 according to the inventive concepts disclosed herein.

As shown in FIGS. 6-8, for example, at least one of the two faces 402 of the IC die 204 may have a surface area greater than a minimum cross-sectional area extending between the sides 404 such that the IC die 204 mechanically interlocks with the mold material 302.

As shown in FIG. 6-9, for example, the IC die 204 may have material removed along at least one of the sides 404 such that the at least one of the sides 404 of the IC die 204 mechanically interlocks with the mold material 302. For example, the wafer processing equipment 108 may remove an amount of the IC die 204 material (e.g., along at least one side 404 and/or at least one face 402) to create a feature that will lock the IC die 204 in place when filled with the mold material 302. For example, the IC die 204 material can be removed mechanically, chemically, or by using a reactive ion etching process.

As shown in FIG. 6, for example, the wafer processing equipment 108 (e.g., the dicing saw 110 and/or etch equipment 112, 114) may remove an amount of the IC die 204 material along at least one side 404 and/or at least one face 402 to create a feature that will mechanically lock the IC die 204 in place when filled with the mold material 302.

As shown in FIG. 7, for example, the wafer processing equipment 108 (e.g., the dicing saw 110, the grinding and/or polishing wheels 116, and/or etch equipment 112, 114) may remove an amount of the IC die 204 material along at least one side 404 and/or at least one face 402 to create a feature that will mechanically lock the IC die 204 in place when filled with the mold material 302. In some embodiments, the interface between the material removed from the IC die 204 along at least one side 404 and/or at least one face 402 may form a rounded interface between the at least one side 404 and at least one face 402.

As shown in FIG. 8, for example, one or more sides 404 may have at least one channel that mechanically interlocks with the mold material 302. For example, the reconstituted wafer 206 may be used for dual side processing.

Figure 9:
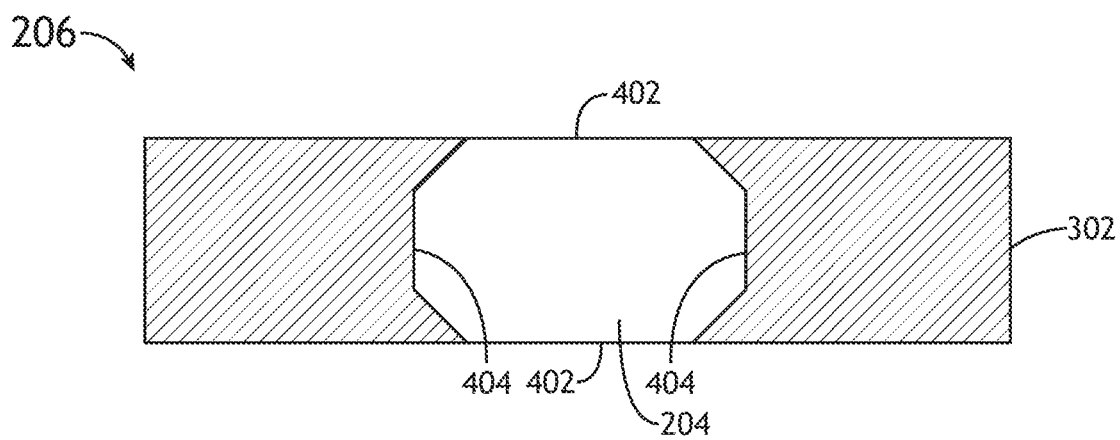
FIG. 9 is a view of an exemplary embodiment of a reconstituted wafer of the system of FIG. 1 according to the inventive concepts disclosed herein.

As shown in FIG. 9, for example, at least one of the two faces 402 of the IC die 204 may have a surface area less than a maximum cross-sectional area extending between the sides 404 such that the IC die 204 mechanically interlocks with the mold material 302. For example, the reconstituted wafer 206 may be used for dual side processing.

Figure 10:
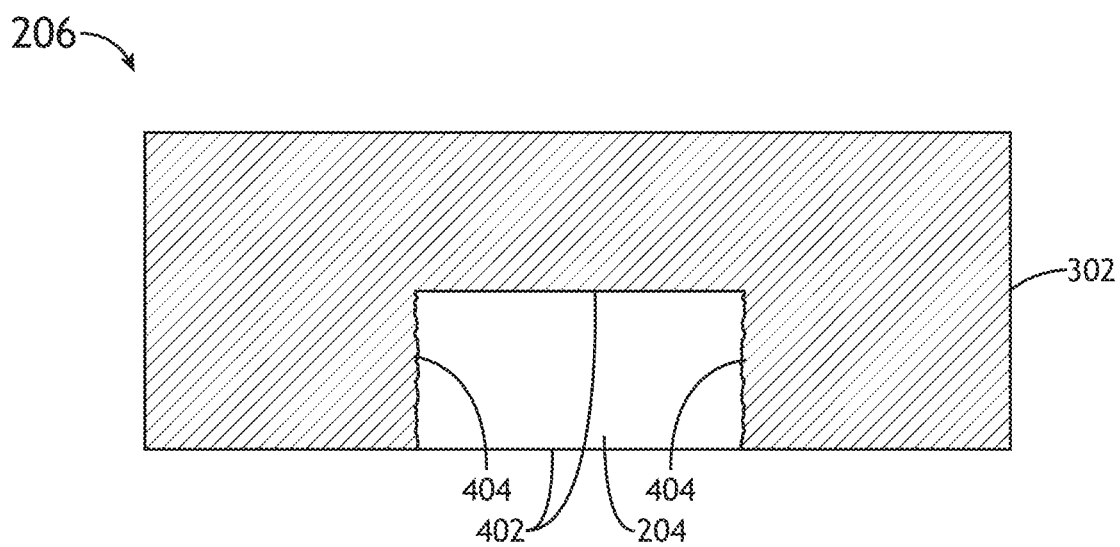
FIG. 10 is a view of an exemplary embodiment of a reconstituted wafer of the system of FIG. 1 according to the inventive concepts disclosed herein.
Figure 11:
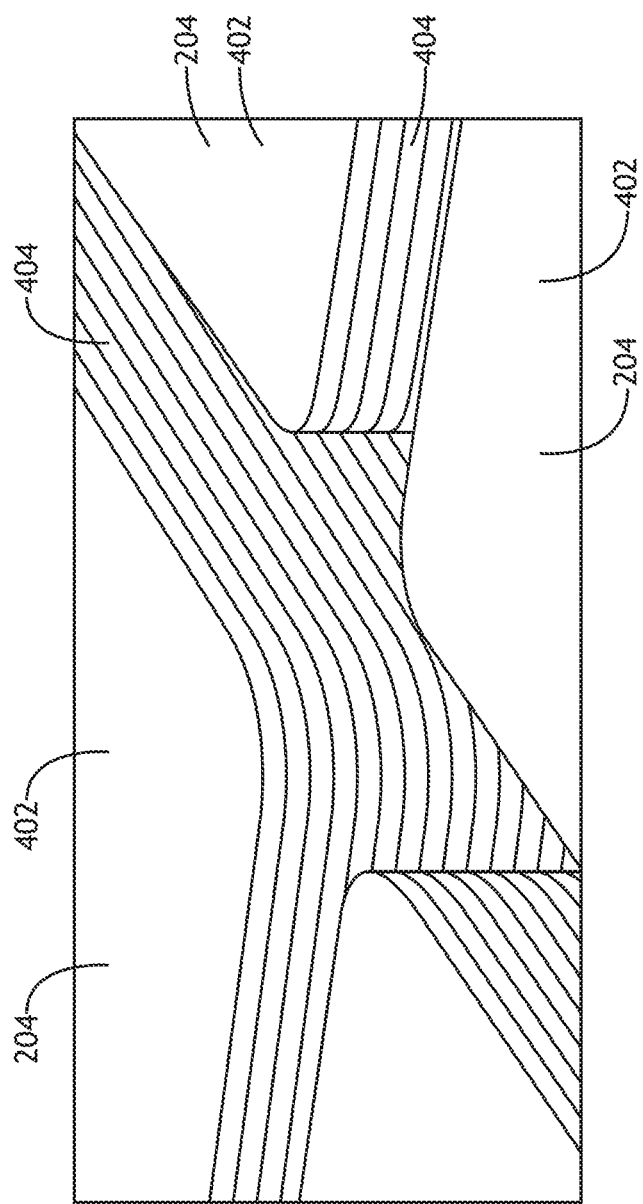
FIG. 11 is a view of an exemplary embodiment of a reconstituted wafer of the system of FIG. 1 according to the inventive concepts disclosed herein.

As shown in FIG. 10-11, for example, at least one side 404 of the sides 404 may have at least one rough surface that mechanically interlocks with the mold material 302. For example, a micro-level interlock that can be imparted to at least one side 404 of the IC die 204 by altering the wafer dicing process. For example, traditional dicing procedures aim to reduce the surface roughness of the die edges. However, if a rough Bosch process is used to singulate dies 204 in a wafer 202, the roughness on the sides 404 of the IC dies 204 may offer volume for the mold material 302 to occupy acting as many micromechanical interlock features. For example, the wafer processing equipment 108 (e.g., the dicing saw 110, the grinding and/or polishing wheels 116, and/or etch equipment 112, 114) can form the rough surface. For example, intentional scalloping or other micro features can be introduced to the die sides 404 by using the Bosch etch/passivate cyclical process.

Figure 12:
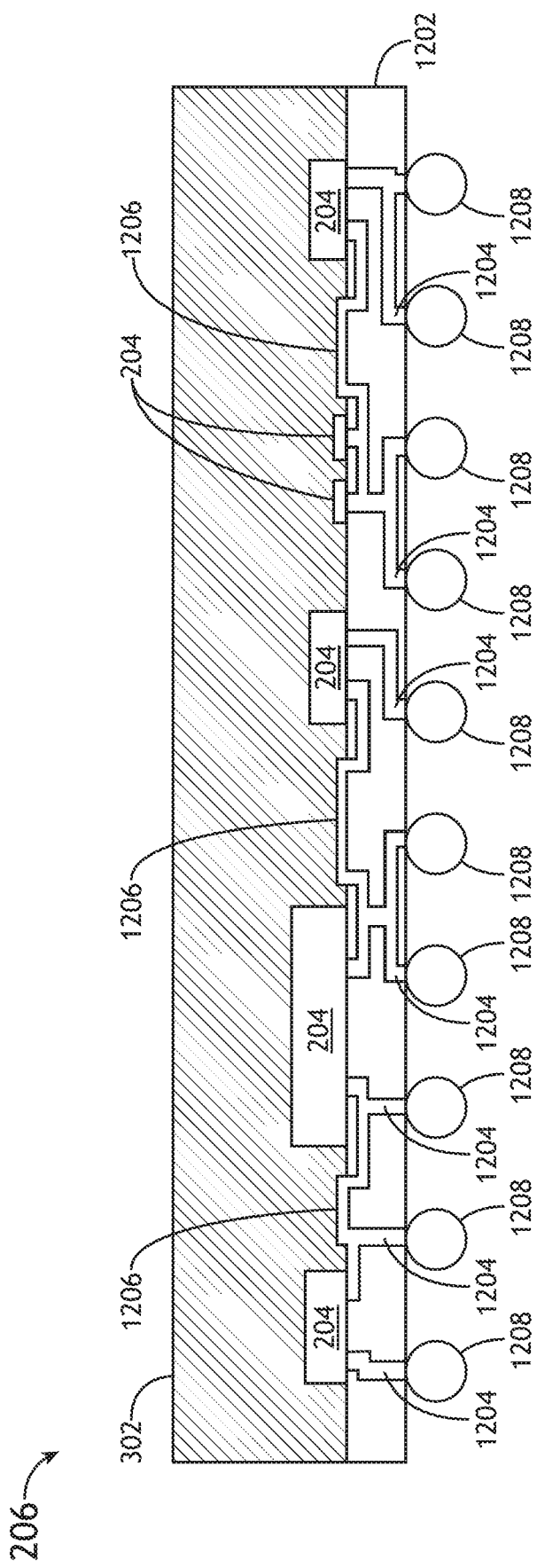
FIG. 12 is a view of an exemplary embodiment of a reconstituted wafer of the system of FIG. 1 according to the inventive concepts disclosed herein.
Figure 13:
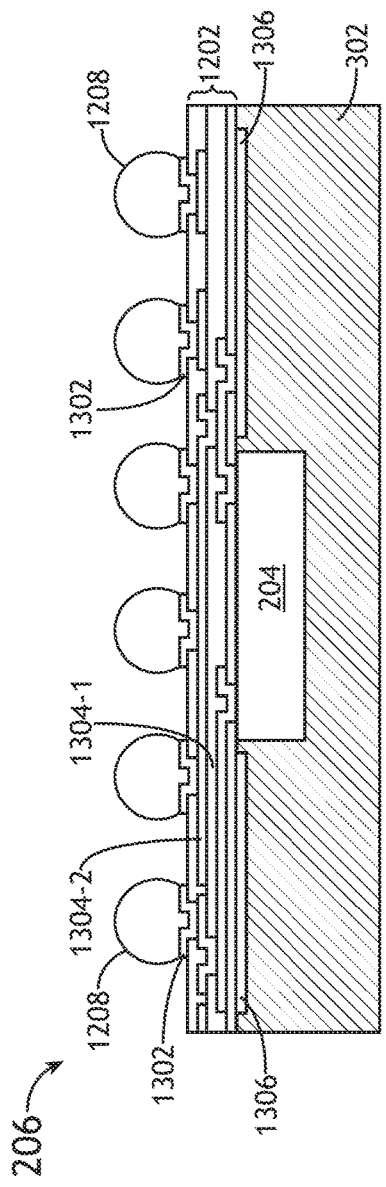
FIG. 13 is a view of an exemplary embodiment of a reconstituted wafer of the system of FIG. 1 according to the inventive concepts disclosed herein.
Figure 14:
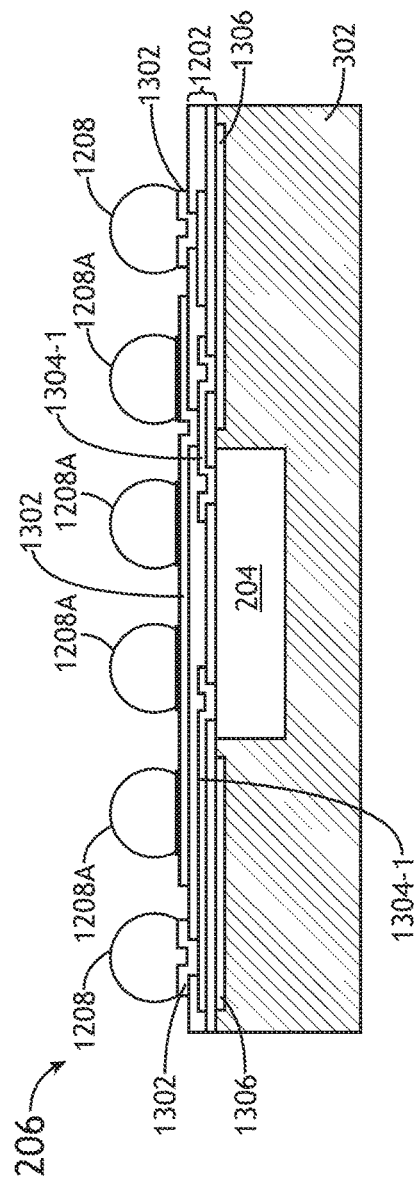
FIG. 14 is a view of an exemplary embodiment of a reconstituted wafer of the system of FIG. 1 according to the inventive concepts disclosed herein.

Referring now to FIGS. 12-14, exemplary embodiments of the reconstituted wafer 206 according to the inventive concepts disclosed herein are depicted. As shown in FIGS. 12-14, the reconstituted wafer 206 may include mold material 302, at least one IC die 204 (e.g., a plurality of IC dies 204), at least one redistribution layer 1202, at least one signal pad (e.g., at least one signal ball 1208 and/or at least one signal pin), at least one under bump metallization (UBM) layer 1302, and/or at least one ground pad (e.g., at least one ground ball 1208A and/or at least one ground pin).

Each IC die 204 may have two faces 402 and sides 404.

The mold material 302 may surround at least the sides 404 of each IC die 204. In some embodiments, the reconstituted wafer 206 may have backside mold material 302. In some embodiments, the reconstituted wafer 206 may lack backside mold material 302 such that the two faces 402 of one or more of the at least one IC die 204 are exposed. In some embodiments, the mold material 302 does not surround either of the two faces 402.

The redistribution layer 1202 may be positioned between (a) the signal pads and (b) the mold material 302 and each IC die 204. The redistribution layer 1202 may have conductive paths 1204 (e.g., at least one stripline transmission line 1304-1, 1304-2) at least connecting an IC die 204 and at least some of the signal pads. The redistribution layer 1202 may include at least one ground.

A surface of the mold material 302 may abut the redistribution layer 1202. The surface of the mold material 302 may include at least one recessed area having at least one conductive feature (e.g., at least one conductive path 1206 and/or at least one ground feature (e.g., at least one ground plane 1306)) connected to at least one of the conductive paths 1204 or the IC die 204. In some embodiments, the ground feature may provide a ground reference for stripline routing of signals in a layer of the redistribution layer 1202 closest to the IC die 204; such signals may be relatively sensitive or relatively high speed signals in the layer of the redistribution layer 1202 closest to the IC die 204, the relatively sensitive or relatively high speed signals being more sensitive or having a higher speed than in a second layer of the redistribution layer 1202, the second layer being farther away from the IC die 204 than the layer. The at least one conductive feature of the at least one recessed area may be referred to as at least one zero$^{th}$ layer conductive feature.

In some embodiments, the reconstituted wafer 206 may include a first IC die 204 and a second IC die 204, which may be interconnected by the at least one conductive path 1204 and/or the at least one conductive feature (e.g., the at least one conductive path 1206).

In some embodiments, embedding conductive features into the mold material 302 of reconstituted wafers 206 may provide significant value to microelectronic packaging capabilities. Designs can be miniaturized by incorporating device interconnect, redistribution, and/or grounding into the mold material 302 of the reconstituted wafer 206. Similarly, individual package capability may be enhanced by expanding the design space from the redistribution layer 1202 into the device layer of the reconstituted wafer 206.

In some embodiments, creating a reconstituted wafer 206 having the at least one conductive feature of the at least one recessed area of the mold material 302 may be performed by the wafer processing equipment 108. For example, the zero$^{th}$ layer conductive features may be placed or deposited. If the zero$^{th}$ layer conductive features are to be placed, the zero$^{th}$ layer conductive features (e.g., jumpers, wires, etc.) can be placed in a specified location using pick-and-place equipment 118. If the zero$^{th}$ layer conductive features are to be deposited, the zero$^{th}$ layer conductive features may be deposited at specified locations, for example, by using a masking material and may be built up via physical and/or chemical vapor deposition, electroplating, aerosol jet dispense systems, etc. The zero$^{th}$ layer conductive features may be deposited and/or pick and placed on a non-wetting surface. Other zero$^{th}$ layer components (e.g., IC dies 204, resistors, capacitors, etc.) may be pick and placed onto the non-wetting surface. The zero$^{th}$ layer conductive features and other zero$^{th}$ layer components may be encapsulated with the mold material 302. A redistribution layer 1202 may be built on top of the mold material 302 and zero$^{th}$ layer features by the wafer processing equipment 108 to connect and/or route zero$^{th}$ layer conductive features and other zero$^{th}$ layer components in a desired fashion. Typical redistribution layer 1202 buildup often includes, but is not limited to, the following processes: photolithography, vapor deposition, electroplating, and/or aerosol jet printing. Typical redistribution layer 1202 buildup often includes, but is not limited to, the following materials: nickel, gold, copper, platinum, and/or permanent photoresist.

As shown in FIG. 12, some embodiments may expand the capabilities of microelectronic packaging through a method of embedding printed or deposited conductive features (e.g., conductive paths 1206 (e.g., traces and/or conductive jumpers) and/or ground planes 1306) into the mold material 302 of a reconstituted wafer 206 by the wafer processing equipment 108. For example, conductive traces or jumpers may be positioned in a recessed portion of the surface layer of the mold material 302. For example, the conductive features can be printed via a controlled dispense process, via thin film deposition, and/or picked and placed using an automated placement process along with the package devices. Some embodiments may free up space in the redistribution layer 1202 by integrating some traces and device interconnect into the mold material 302.

As shown in FIG. 13, some embodiments include a zero$^{th}$ layer ground reference for stripline routing of sensitive or high speed signals in a first layer (e.g., closest to the IC die 204) of a standard 2-layer redistribution layer 1202. The first layer can be important for break-out routing of dense or sensitive signals, and often cannot be dedicated as a ground plane. Such constraint commonly exists in printed circuit board (PCB) routing layer design, as well, which wafer reconstitution and fanout wafer level packaging in general can provide an alternative to. In some embodiments, using the zero$^{th}$ layer as a ground reference not only has the potential to reduce the required layer count by 1 or 2 layers, but can potentially offer the cleanest possible routing for high speed or sensitive radiofrequency (RF) and/or digital signals.

As shown in FIG. 14, an exemplary embodiment of a reconstituted wafer 206 is shown. The reconstituted wafer 206 may include a possible break-out (e.g., a cleanest possible break-out) by combining stripline configuration with utilizing the UBM layer 1302 for ground to provide minimized via staggering.

Referring now to FIG. 15, an exemplary embodiment of a method 1500 according to the inventive concepts disclosed herein may include one or more of the following steps. Additionally, for example, some embodiments may include performing one more instances of the method 1500 iteratively, concurrently, and/or sequentially. Additionally, for example, at least some of the steps of the method 1500 may be performed in parallel and/or concurrently. Additionally, in some embodiments, at least some of the steps of the method 1500 may be performed non-sequentially. Additionally, in some embodiments, at least some of the steps of the method 1500 may be performed in sub-steps of providing various components. In some embodiments, the method 1500 may be performed by the wafer processing equipment 108.

A step 1502 may include creating a reconstituted wafer, the reconstituted wafer comprising a plurality of integrated circuit (IC) dies and a mold material, the plurality of IC dies comprising an IC die, the IC die having two faces and sides, wherein the mold material surrounds at least the sides of the IC die, wherein the plurality of IC dies are mechanically interlocked with the mold material.

Further, the method 1500 may include any of the operations disclosed throughout.

Referring now to FIG. 16, an exemplary embodiment of a method 1600 according to the inventive concepts disclosed herein may include one or more of the following steps. Additionally, for example, some embodiments may include performing one more instances of the method 1600 iteratively, concurrently, and/or sequentially. Additionally, for example, at least some of the steps of the method 1600 may be performed in parallel and/or concurrently. Additionally, in some embodiments, at least some of the steps of the method 1600 may be performed non-sequentially. Additionally, in some embodiments, at least some of the steps of the method 1600 may be performed in sub-steps of providing various components. In some embodiments, the method 1600 may be performed by the wafer processing equipment 108.

A step 1602 may include creating a reconstituted wafer, the reconstituted wafer comprising an integrated circuit (IC), a mold material, a redistribution layer, and signal pads, wherein the IC die has two faces and sides, wherein the mold material surrounds at least the sides of the IC die, wherein the redistribution layer is positioned between (a) the signal pads and (b) the mold material and the IC die, wherein redistribution layer has conductive paths at least connecting the IC die and at least some of the signal pads, wherein a surface of the mold material abuts the redistribution layer, wherein the surface of the mold material includes at least one recessed area having at least one conductive feature connected to at least one of the conductive paths or the IC die.

Further, the method 1600 may include any of the operations disclosed throughout.

As will be appreciated from the above, embodiments of the inventive concepts disclosed herein may be directed to a method and a system including at least one IC die and mold material.

As used throughout and as would be appreciated by those skilled in the art, "at least one non-transitory computer-readable medium" may refer to as at least one non-transitory computer-readable medium (e.g., at least one memory device (e.g., a non-volatile memory device); e.g., at least one memristor; e.g., at least one computer-readable medium implemented as hardware; e.g., at least one non-transitory processor-readable medium, at least one memory (e.g., at least one nonvolatile memory, at least one volatile memory, or a combination thereof; e.g., at least one random-access memory, at least one flash memory, at least one read-only memory (ROM) (e.g., at least one electrically erasable programmable read-only memory (EEPROM)), at least one on-processor memory (e.g., at least one on-processor cache, at least one on-processor buffer, at least one on-processor flash memory, at least one on-processor EEPROM, or a combination thereof), or a combination thereof), at least one storage device (e.g., at least one hard-disk drive, at least one tape drive, at least one solid-state drive, at least one flash drive, at least one readable and/or writable disk of at least one optical drive configured to read from and/or write to the at least one readable and/or writable disk, or a combination thereof), or a combination thereof).

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more. Further, as used throughout, "zero or more" means zero, one, or a plurality of; for example, "zero or more" may comprise zero, one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A system, comprising:
   a reconstituted wafer, comprising:
      a plurality of integrated circuit (IC) dies including an IC die having two faces and sides;
      mold material surrounding at least the sides of the IC die, wherein the IC die is mechanically interlocked with the mold material, wherein the plurality of IC dies are mechanically interlocked with the mold material;
      a redistribution layer; and
      signal pads,
      wherein an inactive face of the two faces has at least two channels that mechanically interlock with the mold material,
      wherein the inactive face of the two faces has at least one rough surface that mechanically interlocks with the mold material,
      wherein the IC die has material removed along at least one of the sides such that the at least one of the sides of the IC die mechanically interlocks with the mold material,
      wherein the redistribution layer is positioned between (a) the signal pads and (b) the mold material and the plurality of IC dies, wherein the redistribution layer has conductive paths at least connecting the IC die and the signal pads; wherein a surface of the mold material and one of the faces of the IC die abut the redistribution layer, wherein the surface of the mold material includes at least one recessed area having at least one conductive feature connected to at least one of the conductive paths or the IC die.

2. The system of claim 1, wherein the reconstituted wafer has backside mold material.

3. The system of claim 1, wherein the reconstituted wafer has no backside mold material, wherein the two faces of the IC die are exposed.

4. The system of claim 1, wherein the mold material does not surround either of the two faces.

5. The system of claim 1, wherein at least one side of the sides has at least one channel that mechanically interlocks with the mold material, wherein a given channel of the at least one channel is positioned at a midpoint of a given side of the sides, wherein the given channel is in between edges of the two faces.

6. The system of claim 1, wherein at least one side of the sides has at least one rough surface that mechanically interlocks with the mold material.

7. The system of claim 6, wherein the at least one rough surface of the at least one side of the sides is formed via a Bosch etch process.

8. The system of claim 6, wherein the at least one rough surface of the at least one side of the sides includes scalloping.

9. The system of claim 1, wherein both of the two faces of the IC die have a surface area less than a maximum cross-sectional area extending between the sides such that the IC die mechanically interlocks with the mold material.

10. The system of claim 1, wherein both of the two faces of the IC die have a surface area greater than a minimum cross-sectional area extending between the sides such that the IC die mechanically interlocks with the mold material.

11. The system of claim 1, wherein the IC die is an application specific integrated circuit (ASIC) die, a field-programmable gate array (FPGA) die, a central processing unit (CPU) die, or a graphics processing unit (GPU) die.

12. A method, comprising:
   creating a reconstituted wafer, the reconstituted wafer comprising a plurality of integrated circuit (IC) dies, a mold material, a redistribution layer, and signal pads, the plurality of IC dies comprising an IC die, the IC die having two faces and sides, wherein the mold material surrounds at least the sides of the IC die, wherein the IC die is mechanically interlocked with the mold material, wherein the plurality of IC dies are mechanically interlocked with the mold material,
   wherein an inactive face of the two faces has at least two channels that mechanically interlock with the mold material,
   wherein the inactive face of the two faces has at least one rough surface that mechanically interlocks with the mold material,
   wherein the IC die has material removed along at least one of the sides such that the at least one of the sides of the IC die mechanically interlocks with the mold material,
   wherein the redistribution layer is positioned between (a) the signal pads and (b) the mold material and the plurality of IC dies, wherein the redistribution layer has conductive paths at least connecting the IC die and the signal pads; wherein a surface of the mold material and one of the faces of the IC die abut the redistribution layer, wherein the surface of the mold material includes at least one recessed area having at least one conductive feature connected to at least one of the conductive paths or the IC die.

* * * * *